United States Patent [19]

Cumberton et al.

[11] Patent Number: 4,493,082
[45] Date of Patent: Jan. 8, 1985

[54] SOFT DECISION CONVOLUTIONAL CODE TRANSMISSION SYSTEMS

[75] Inventors: John Cumberton, Danbury, Conn.; Alun E. Foster, Groot-Bijgaarden, Belgium; Alexander S. Rae, Farnham, England; Vernon J. Fernandes, Tilehurst, England; Michael R. Carter, Maidenhead, England

[73] Assignee: Plessey Overseas Limited, Ilford, England

[21] Appl. No.: 320,923

[22] Filed: Nov. 13, 1981

[30] Foreign Application Priority Data

Nov. 14, 1980 [GB] United Kingdom ............... 8036705

[51] Int. Cl.³ .......................................... G06F 11/10
[52] U.S. Cl. .................................................... 371/43
[58] Field of Search .............................. 371/43, 44, 45

[56] References Cited

U.S. PATENT DOCUMENTS

| | | | |
|---|---|---|---|
| 3,891,959 | 6/1975 | Tsuji et al. | 371/43 |
| 4,035,767 | 7/1977 | Chen et al. | 371/43 |
| 4,178,550 | 12/1979 | Acampora et al. | 371/43 |
| 4,211,996 | 7/1980 | Nakamura | 371/43 |
| 4,217,660 | 8/1980 | En | 371/44 |

Primary Examiner—Charles E. Atkinson
Attorney, Agent, or Firm—Fleit, Jacobson, Cohn & Price

[57] ABSTRACT

A data transmission system in which data is transmitted in a form incorporating additional data providing for error correction at the receiver. The data is encoded in a transmitter using a signal mapping system which maps a number of original digits and also digits produced by a convolutional encoder. The data at the receiver is decoded using hard and soft decision decoding which can correct errors in the received data.

12 Claims, 16 Drawing Figures

FIG. 6. Example showing calculation of scores in trellis development process; received dibit = 01. Full line is chosen transition. Dashed line is transition not chosen (usually one with higher score).

$DCN \propto (DN)^2$

FIG. 9.

| 8-BIT RECEIVED COORDINATE BIT NO 7 6 5 4 3 2 1 0 | TRANSMITTED LEVEL | 8-BIT RECEIVED COORDINATE BIT NO 7 6 5 4 3 2 1 0 | TRANSMITTED LEVEL |
|---|---|---|---|
| 0 0 1 0 1 0 0 0<br>0 0 1 0 0 1 1 1<br>0 0 1 0 0 1 1 0<br>0 0 1 0 0 1 0 1<br>0 0 1 0 0 1 0 0<br>0 0 1 0 0 0 1 1<br>0 0 1 0 0 0 1 0<br>0 0 1 0 0 0 0 1<br>0 0 1 0 0 0 0 0 | | 1 1 1 1 1 1 1 1<br>1 1 1 1 1 1 1 0<br>1 1 1 1 1 1 0 1<br>1 1 1 1 1 1 0 0<br>1 1 1 1 1 0 1 1<br>1 1 1 1 1 0 1 0<br>1 1 1 1 1 0 0 1<br>1 1 1 1 1 0 0 0 | −1 |
| 0 0 0 1 1 1 1 1<br>0 0 0 1 1 1 1 0<br>0 0 0 1 1 1 0 1<br>0 0 0 1 1 1 0 0<br>0 0 0 1 1 0 1 1<br>0 0 0 1 1 0 1 0<br>0 0 0 1 1 0 0 1<br>0 0 0 1 1 0 0 0 | +7 | 1 1 1 1 0 1 1 1<br>1 1 1 1 0 1 1 0<br>1 1 1 1 0 1 0 1<br>1 1 1 1 0 1 0 0<br>1 1 1 1 0 0 1 1<br>1 1 1 1 0 0 1 0<br>1 1 1 1 0 0 0 1<br>1 1 1 1 0 0 0 0 | −3 |
| 0 0 0 1 0 1 1 1<br>0 0 0 1 0 1 1 0<br>0 0 0 1 0 1 0 1<br>0 0 0 1 0 1 0 0<br>0 0 0 1 0 0 1 1<br>0 0 0 1 0 0 1 0<br>0 0 0 1 0 0 0 1<br>0 0 0 1 0 0 0 0 | +5 | 1 1 1 0 1 1 1 1<br>1 1 1 0 1 1 1 0<br>1 1 1 0 1 1 0 1<br>1 1 1 0 1 1 0 0<br>1 1 1 0 1 0 1 1<br>1 1 1 0 1 0 1 0<br>1 1 1 0 1 0 0 1<br>1 1 1 0 1 0 0 0 | −5 |
| 0 0 0 0 1 1 1 1<br>0 0 0 0 1 1 1 0<br>0 0 0 0 1 1 0 1<br>0 0 0 0 1 1 0 0<br>0 0 0 0 1 0 1 1<br>0 0 0 0 1 0 1 0<br>0 0 0 0 1 0 0 1<br>0 0 0 0 1 0 0 0 | +3 | 1 1 1 0 0 1 1 1<br>1 1 1 0 0 1 1 0<br>1 1 1 0 0 1 0 1<br>1 1 1 0 0 1 0 0<br>1 1 1 0 0 0 1 1<br>1 1 1 0 0 0 1 0<br>1 1 1 0 0 0 0 1<br>1 1 1 0 0 0 0 0 | −7 |
| 0 0 0 0 0 1 1 1<br>0 0 0 0 0 1 1 0<br>0 0 0 0 0 1 0 1<br>0 0 0 0 0 1 0 0<br>0 0 0 0 0 0 1 1<br>0 0 0 0 0 0 1 0<br>0 0 0 0 0 0 0 1<br>0 0 0 0 0 0 0 0 | +1 | 1 1 0 1 1 1 1 1<br>1 1 0 1 1 1 1 0<br>1 1 0 1 1 1 0 1<br>1 1 0 1 1 1 0 0<br>1 1 0 1 1 0 1 1<br>1 1 0 1 1 0 1 0<br>1 1 0 1 1 0 0 1<br>1 1 0 1 1 0 0 0<br>1 1 0 1 0 1 1 1 | |

SOFT DECISION CONVOLUTIONAL CODE TRANSMISSION SYSTEMS

The present invention relates to transmission systems and more particularly to a transmission system incorporating a transmitter and a receiver in which information is transmitted by a code incorporating redundancy to allow error correction with soft decision at the receiver.

It is an object of the present invention to provide a data transmission modem suitable for digital data or digitised analogue communication at a given transmission rate and with a much lower error rate in the presence of a given signal-to-noise ratio than that for a system using no redundancy.

Accordingly the present invention provides a transmission system for the transmission of data from a transmitter to a receiver including a transmitter containing a convolutional encoder and a signal mapping device connected thereto to produce a two dimensional coded output signal, and including a receiver containing a convolutional decoder with soft decision decoding, connected to a reverse mapping means to produce output data.

The present invention also provides a transmitter and a receiver for the transmission system and is designed for use with a modem in which both transmitter and receiver are incorporated.

The present invention will now be described by way of example with reference to the accompanying drawings in which.

Figure 1:
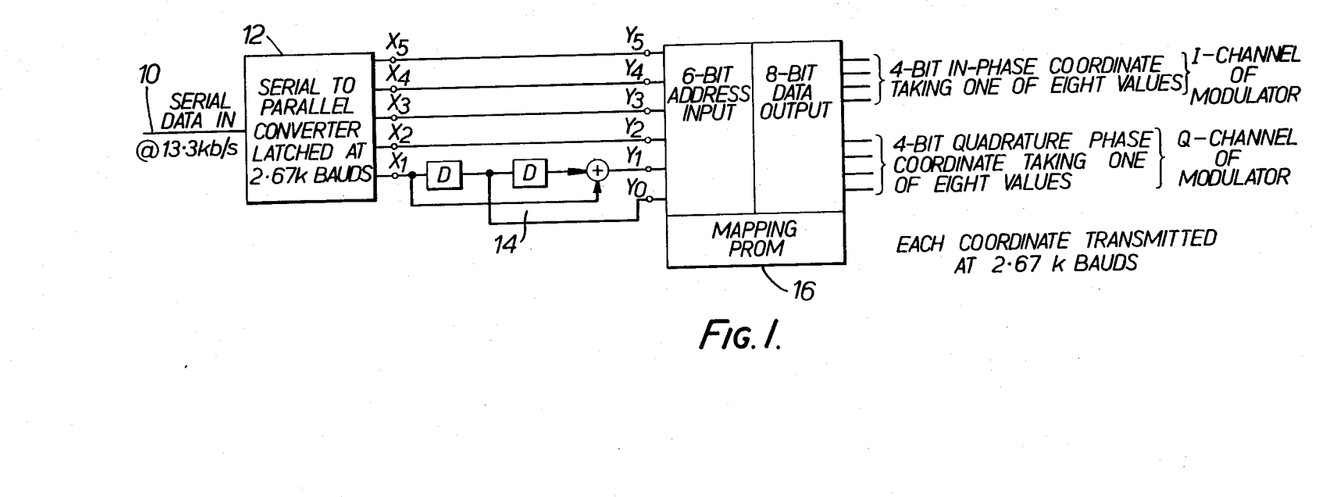
FIG. 1 shows in block diagrammatic form the encoding section of a transmitter according to the present invention.

The present modem transmitter shown in FIG. 1 converts groups of six data bits into symbols, each of which may take one of 64 values. Quadrature amplitude modulation is used and the transmitted points in the complex signal space are arranged in an 8 by 8 square grid. The error correcting code converts groups of five data bits into groups of six bits which are then converted into the complex signal space co-ordinates. In the decoding process carried out in the receiver of FIG. 2 the redundancy is exploited to obtain the groups of five data bits from the received sets of co-ordinates. The error correcting modem has a user data rate of 13.3 kb/s. If desired, other data rates may be used with the appropriate modem design. Data is received at the terminal 10 in a serial form and converted by a serial to parallel converter 12 into parallel five-bit data words.

Figure 3:
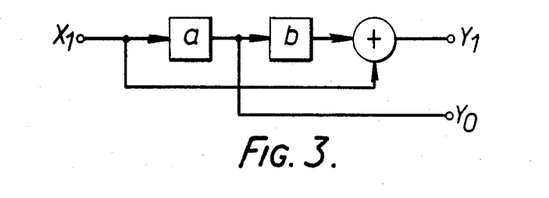
FIG. 3 shows the convolutional encoder of FIG. 1.
Figure 5:
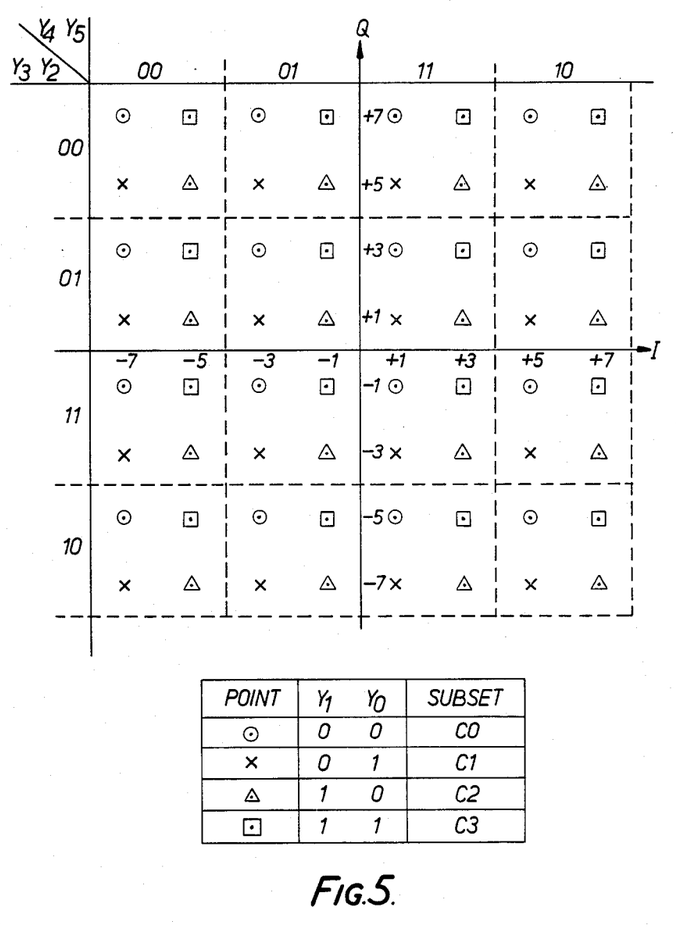
FIG. 5 shows the signal space mapping diagram for the decoding process.

The conversion of 5-bit data words into 6-bit words is achieved by passing the four most significant bits X5 through X2 unchanged and using a ½ rate convolutional encoder 14 (see FIG. 3) to convert the least significant data bit X1 into the two least significant bits of the 6-bit word (see FIG. 3). The 6-bit words are mapped into the 64-point complex signal space by mapping device 16 according to the mapping shown in FIG. 5 and are transmitted to line by modulators (not shown). The mapping device 16 maps bits $Y_0$ through $Y_5$ to co-ordinates I, Q as shown in FIG. 5. Each co-ordinate is transmitted as a 4 bit coded amplitude. This principle may be extended using for example 7-bit data words by passing the six most significant bits through unchanged and using a convolutional encoder on the last bit. Other convolutional encoding may be used such as a ⅔ rate encoder operating on the two least significant bits. Also other mapping configurations such as equilateral triangles, rhombus or hexagon may be used.

Figure 2:
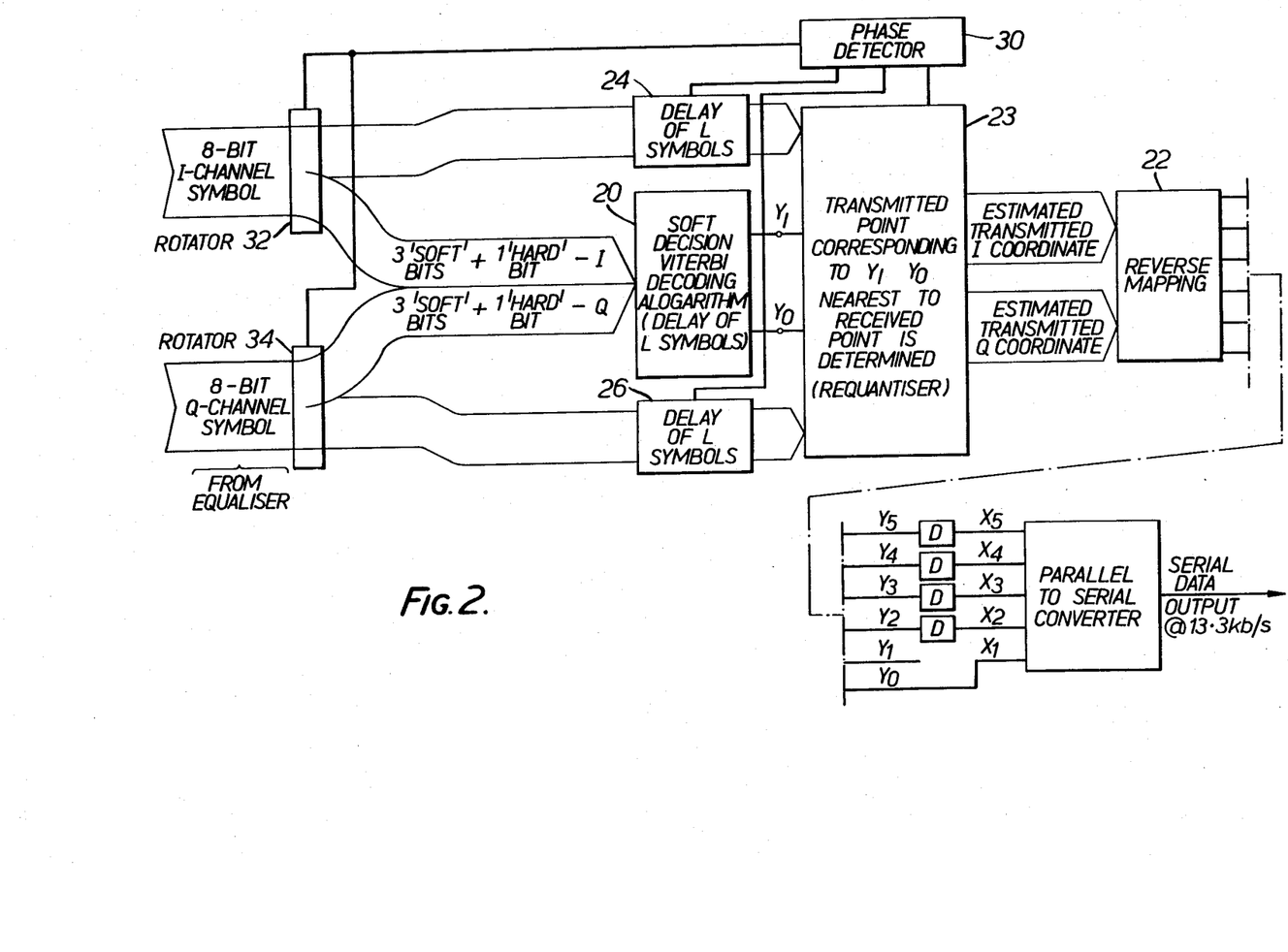
FIG. 2 shows the decoding section of a receiver for reception and decoding of the signals from the transmitter of FIG. 1.

In the decoding process carried out in the decoder of FIG. 2, soft decision information from the demodulator and equaliser (not shown) is used by the Viterbi algorithm detector 20 to decide which set of two convolutionally encoded bits ($Y_1$ and $Y_0$) was most likely to have been transmitted. The two corrected bits are used to set up threshold levels between the 16 points assigned to these two bits. The region in which the received point lies determines which of the sixteen was most likely to have been transmitted. From this the 6-bit coded word is found using the reverse mapping apparatus 22. The 5-bit data word is then obtained as shown in FIG. 2.

The performance of the error correcting code expected from theory is as follows:

Theory shows that for our error correcting code the probability of an error event would approach the following asymptote with increasing signal-to-noise ratio if an unlimited number of soft decision bits were available:

$$P_e = N_1 Q\{d_0/\sigma\}$$

wherein
 $d_0$ is the minimum distance between transmitted points in the 64-point space,
 $\sigma^2$ is the noise variance per dimension of the signal space,
 $Q\{x\}$ is the Gaussian error probability function.
For the 16 kb/s uncoded mode, $$P_e = N_2 Q\{d_0/2\sigma\}$$

$N_1$ and $N_2$ are constants which are not very different from each other. From the above it is seen that the theoretically maximum coding gain of 13.3 kb/s coded over 16 kb/s uncoded is about 6 dB.

Another mode was used for comparison: 13.3 kb/s uncoded. For this mode the innermost 32 points of the 64-point space were transmitted. The "coding gain" of 13.3 kb/s uncoded over 16 kb/s uncoded is approximately the ratio of their average signal powers for a given distance between nearest points and is about 3.2 dB.

The theoretically maximum coding gain of 13.3 kb/s coded over 13.3 kb/s uncoded is therefore $(6-3.2)=2.8$ dB.

The transmitter of FIG. 1 is organised to transmit 5 data bits per symbol at 13.3 kb/s. In actual fact 6 bits per symbol are taken for onward transmission. The 6th bit is the added redundancy required by the Viterbi algorithm. In order to provide error correction, five data bits are therefore mapped onto a set of 6 bits by carrying over the 4 most significant bits unchanged but generating the 5th and 6th by convolutionally encoding the least significant bit in the uncoded domain. The circuit that performs this operation appears in FIG. 3. Functional operation of the convolutional encoder can be appreciated by considering an example:

| $X_1$ | i/p | 0 | 1 | 0 | 1 | 1 | 0 | 1 |
|---|---|---|---|---|---|---|---|---|
| $Y_1Y_0$ | o/p | 00 | 10 | 01 | 00 | 11 | 11 | 00 |

Figure 4:
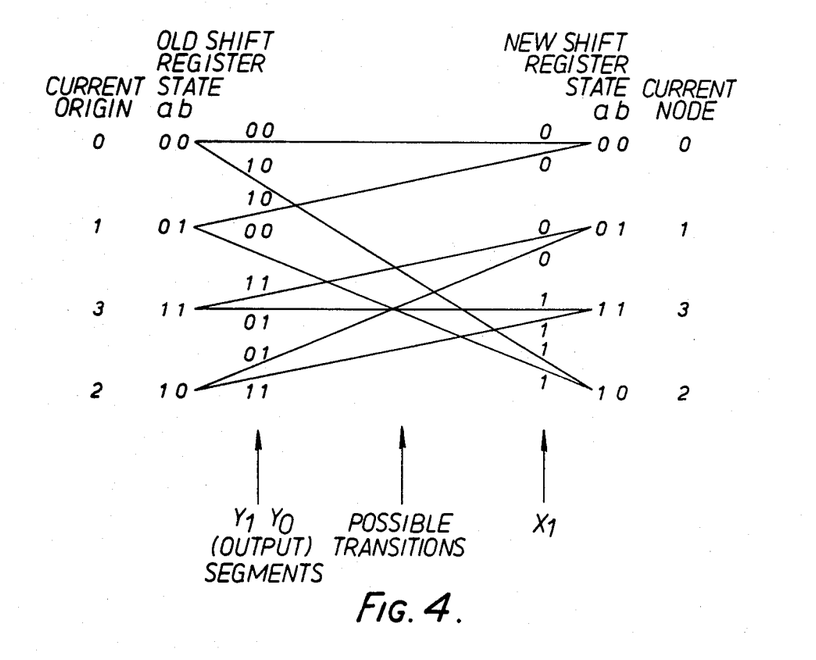
FIG. 4 shows a convolutional encoder trellis diagram illustrating possible transitions.

The above sequence can also be derived by using the trellis diagram of FIG. 4. Here, start at current node 0 and trace the transition paths according to whether a 0 or 1 is received. Remember to return to the origin on the same level as the current node every time a transition has been made and relevant output segment $Y_1Y_0$ noted.

Referring to FIG. 1 the mapping PROM 16 that maps the 6-bit word onto the signal constellation is shown. The scheme employed partitions the 6-bit word into two sections. The two convolutionally encoded bits $Y_1Y_0$ are the C points (C0,C1,C2,C3) shown repeated in the grid structure of FIG. 5. The four most significant bits define the grid square in which a C point lies. Mapping is two dimensional Gray.

Figure 6:
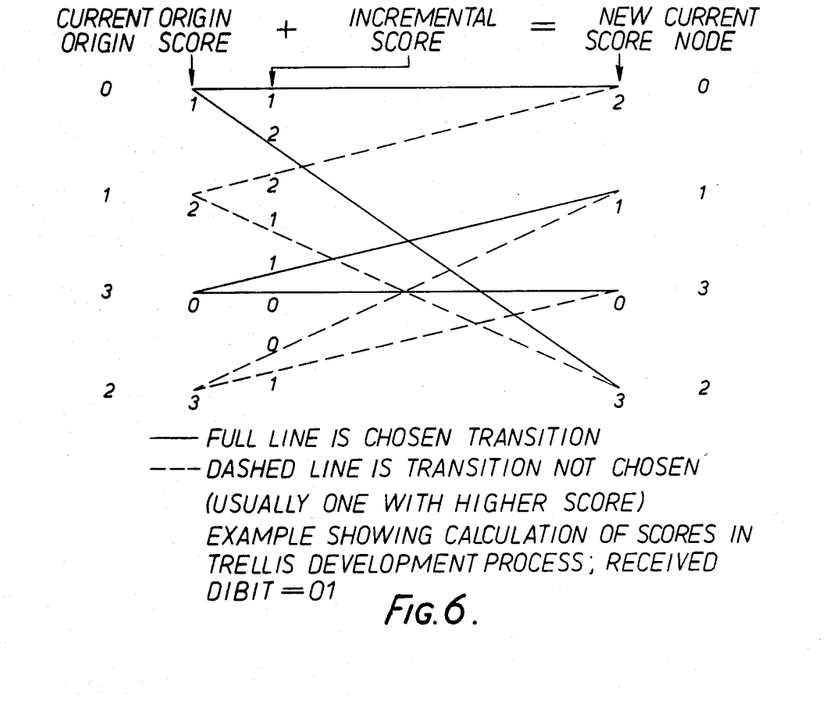
FIG. 6 shows an exemplary trellis diagram showing the calculation of scores in the trellis development process.

At the receiver shown in FIG. 2 the received symbol I and Q co-ordinates define which C point has arrived. Once established, the Viterbi algorithm block 20 generates the trellis diagram in reverse. The principle of the Viterbi algorithm is illustrated by first considering hard decision decoding instead of soft decision decoding which is actually used. Each current node has two transitions arriving at it. As a dibit $Y_1Y_0$ is received the algorithm decides which transition would have been more likely by computing scores to each transition. This is done for all four nodes, so ending with a set of 4 transitions, one to each node. The score is made up of two components, the nodal score at the origin plus the incremental score which is equal to the Hamming distance between the transition code and the $Y_1Y_0$ dibit received. This score is calculated for both transitions and the transition with the lower score is chosen. In this way a network of transitions develops. FIG. 6 shows the decoding process. Note that if the two transitions yield the same new score one of them can be chosen arbitrarily.

Obtaining $X_1$ from the trellis diagram involves tracing back a path made of chosen transitions over L symbols where L is the search length. The path begins at the current node with the least score. The Lth transition gives the $X_1$ bit estimated to have been transmitted.

Figure 7:
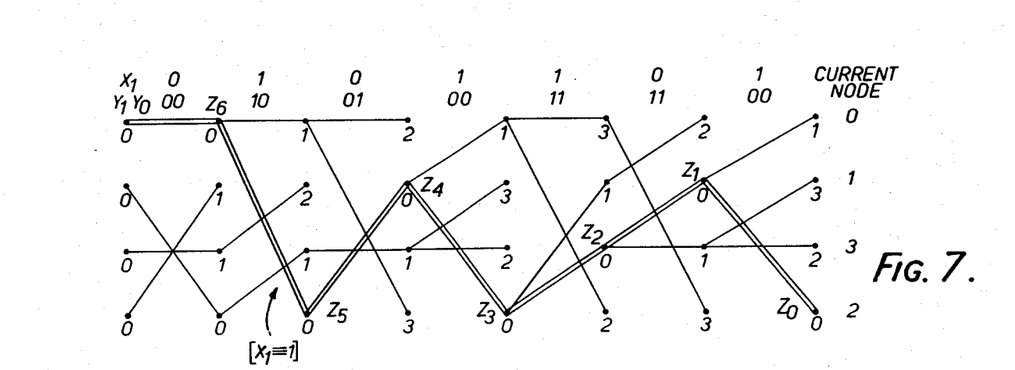
FIG. 7 shows the Viterbi decoding process in an error-free case.

In FIG. 7 the trellis diagram, showing scores, is depicted.

Figure 8:
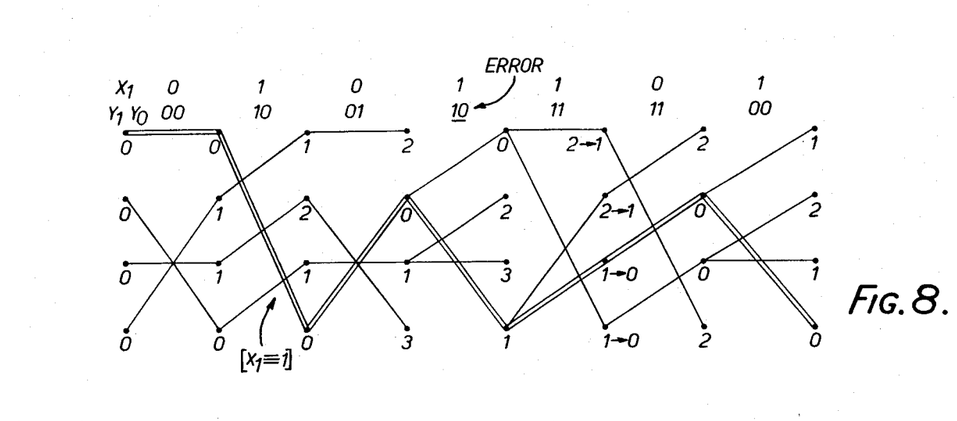
FIG. 8 shows the Viterbi decoding process with one error.

In FIG. 8 a deliberate error inserted into a dibit shows how the Viterbi algorithm handles such an error. The path remains the same in both instances, in spite of the error.

Under error conditions nodal scores can grow to large absolute values. To counter this a normalisation is performed after every set of nodal scores is calculated. The least score is subtracted from the 4 scores. An example of this feature appears in FIG. 8.

With the received trellis diagram set up, the $X_1$ bit estimate can be obtained by following the thick line. In this example a search length of 6 is taken for simplicity. As more symbols arrive the trellis diagram is continually built up in the same manner and the $X_1$ value 6 symbols ago is extracted.

Figure 9:
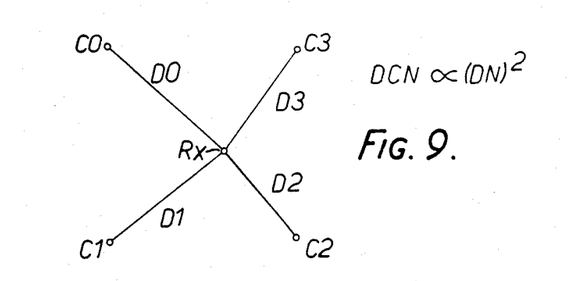
FIG. 9 shows the incremental scoring method according to the present invention.

In the software implementation Hamming distances are not used. The C points in the signal constellation appear in groups of four. Thus every symbol position can be associated with the four C points $C_0C_1C_2C_3$ either within a grid square or overlapping two or more squares depending on the position of the symbol in the IQ plane. So, in place of Hamming distance based incremental scoring, the square of the Euclidean distance between the point and the relevant pair of C points ($\equiv$transitions) is taken as shown in FIG. 9.

In the receiver I and Q co-ordinates are stored as 8 bit words which give good resolution. Bits 0, 1, 2 will be referred to as soft decision bits which give the distance relative to the C points. In practice bits 0-3 from the I and Q co-ordinates are used to generate an 8-bit address for a look up table that stores the incremental scores. See FIG. 10 for a table of co-ordinate values. Bits 3, 4 and 7 are hard decision bits which uniquely define each of the eight levels. Again a trellis is built up, decoding being performed in the same way as in the example above.

Figure 11A:
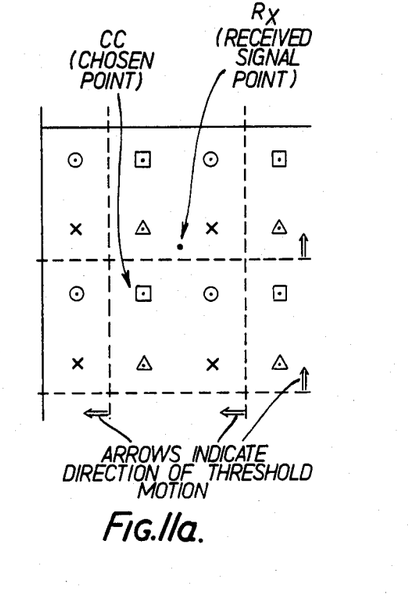
Figure 11B:
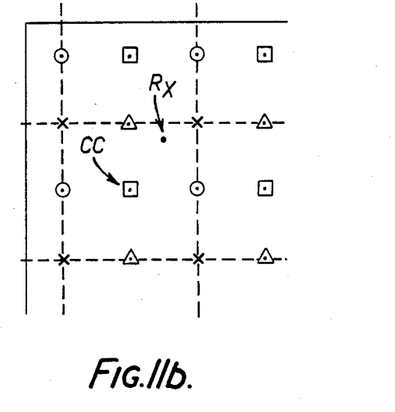

One extra feature is the process of requantisation as shown in FIG. 11. This is a process whereby the hard decision thresholds, i.e. the dashed lines, are moved so that the received co-ordinate and the decoded C point associated with it lie in the same square with the C points forming the corner points of the square.

Consider the following illustrative example. FIG. 11 shows a received symbol position Rx and the chosen C point CC. To ensure that the square surrounds both points the Q horizontal dashed lines should be moved up by ½d. In other words ½d must be subtracted from the Q co-ordinate value. Similarly the vertical dashed lines are translated left by ½d.

The hard decision can now be taken by reading the codes $Y_2Y_3Y_4Y_5$ as per FIG. 5. This gives 4 bits of received information. The remaining two bits are the coded values for the chosen C point i.e. the $Y_1Y_0$ dibit.

Available at the output of the receiver equaliser (not shown in FIG. 2) for every symbol is a digitally encoded version of the I and Q co-ordinates. Eight bits (the most significant bits) are presented to the microprocessor based circuit. The receiver hardware includes an 8085A microprocessor with associated I.C.'s 8155, 8212 and 2716. The 8155 is an I/O peripheral configured as two programmable 8-bit I/O ports (PA→PB) and one programmable 6-bit I/O port (PC). I and Q co-ordinates are fed to ports PA and PB respectively, while PC outputs the decoded but not de-mapped symbols.

Figure 13A:
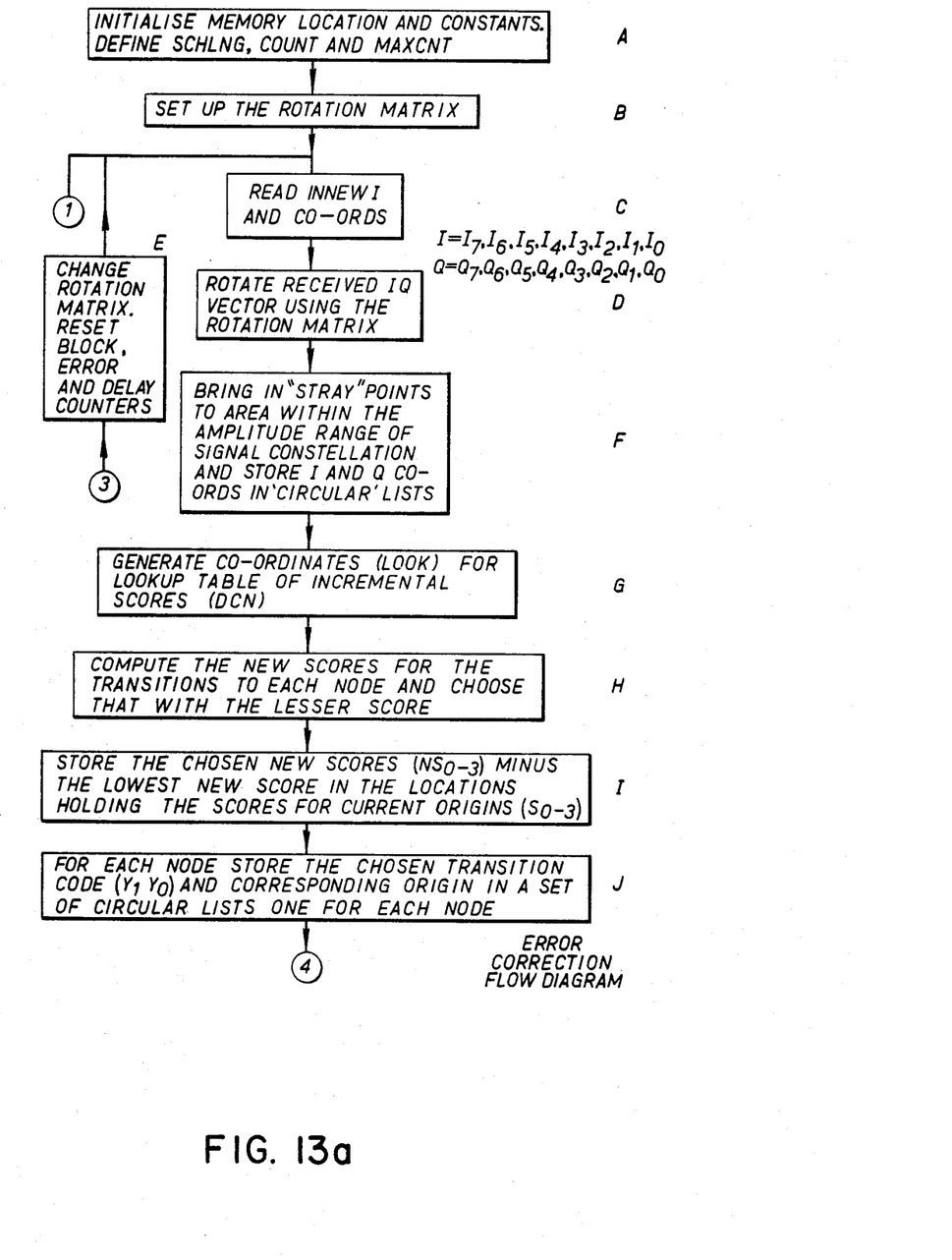
FIGS. 13a, 13b and 13c show a flow diagram for the error correction process carried out in the receiver of FIG. 2.
Figure 13B:
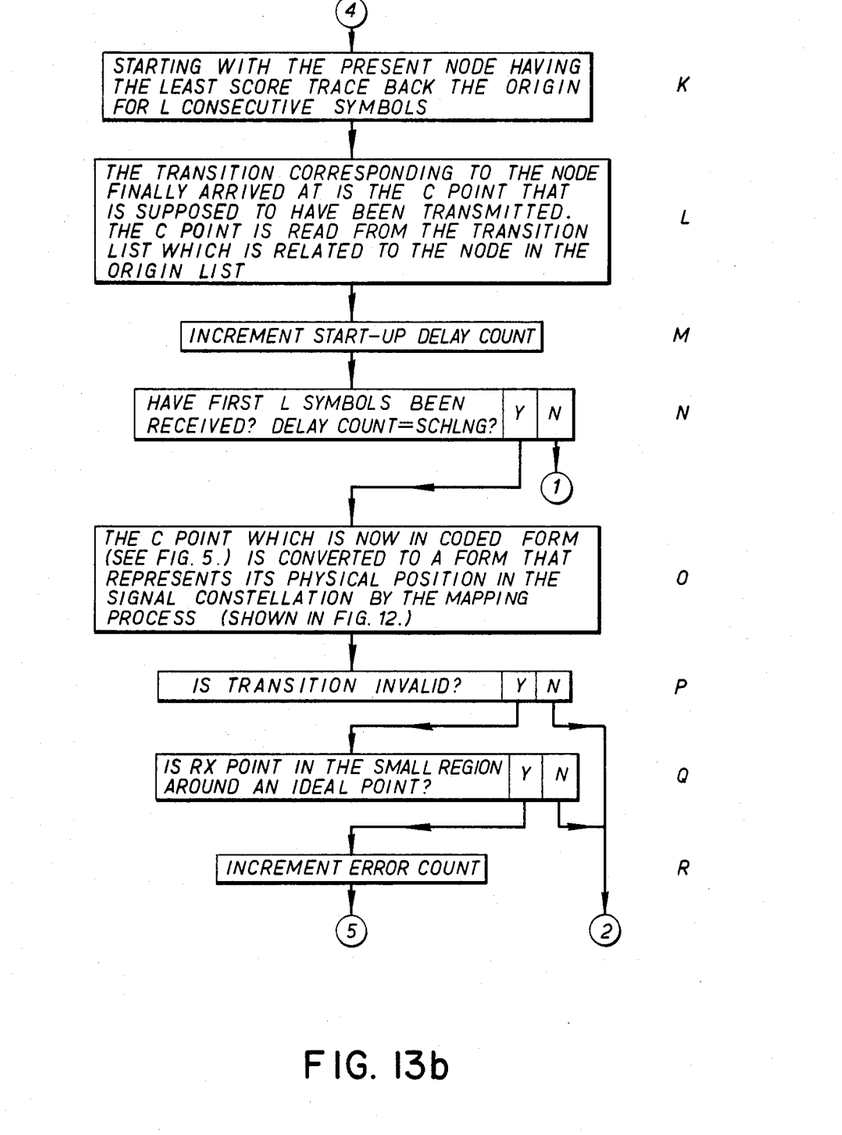
Figure 13C:
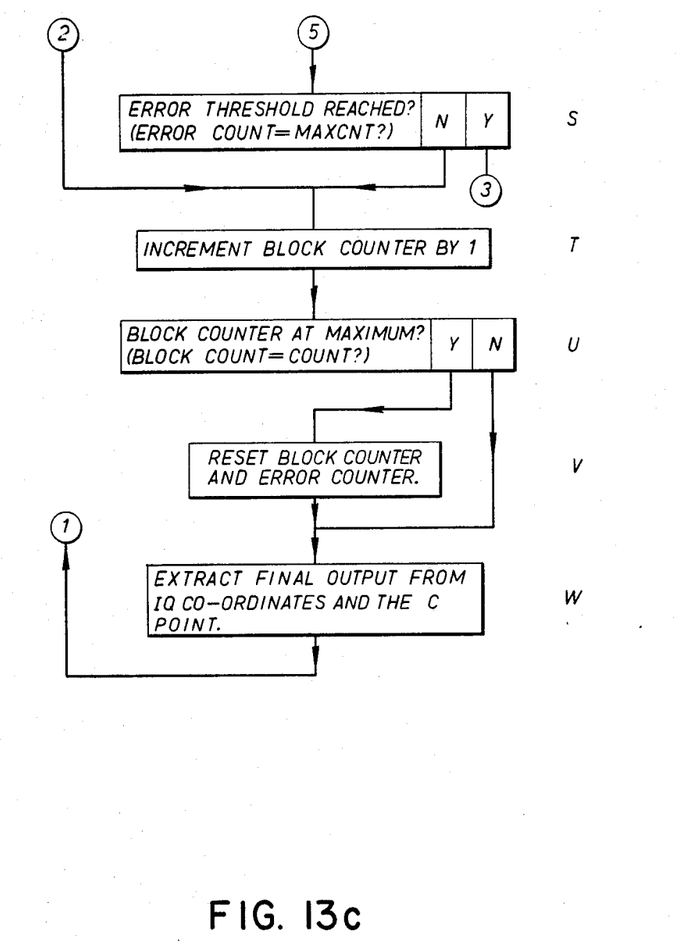

The software implementation of the Viterbi algorithm involves a series of functions as described in FIGS. 13a, 13b and 13c.

The first task for the microprocessor is to initialise memory locations and load constants into the relevant locations. Constants are (1) SCHLNG (L) which is the number of transitions traced over the trellis diagram, (2) COUNT which is the number of consecutive symbols in which errors are counted before the error counter is reset; equivalent to integration, (3) MAXCNT which is the error threshold determining when the algorithm performs a 90° rotation on the received IQ vector. An added feature to the standard Viterbi algorithm is software that rotates the received vector if the Viterbi process is found to be failing at an exceptionally high rate. As there is no rotational symmetry or differential encoding in the FEC signal structure a spurious rotation permanently applied to the demodulated signal will result in a breakdown in the Viterbi decoding action. When such a state is recognised the microprocessor is programmed to add a 90° phase shift to IQ before decoding is done. This is accomplished by a detector 30 which receives inputs from the requantiser 23 and delay blocks 24 and 26. The outputs of the detector 30 control rotators 32 and 34 which perform the rotation of the I and Q channel signals from the equaliser prior to decoding. Should this fail to rectify the high error-rate condition further 90° phase rotations are applied, until satisfactory decoding is obtained. In an ideal condition no phase rotation should be present between the transmitter and receiver. The parameter monitored to enable such a spurious condition to be detected is the comparison between the dibit assigned to the decoded C point (or TRANSITION) and the dibit formed by concatenating bit 3's from the two's complement representation of the delayed I and Q co-ordinates. Further mention of this technique will be made later.

Returning to the flow diagrams in FIGS. 13a, 13b and 13c, Block B sets up the rotational matrix to 0° i.e. no rotation. This is of course the most likely condition encountered in practice.

Figure 10:
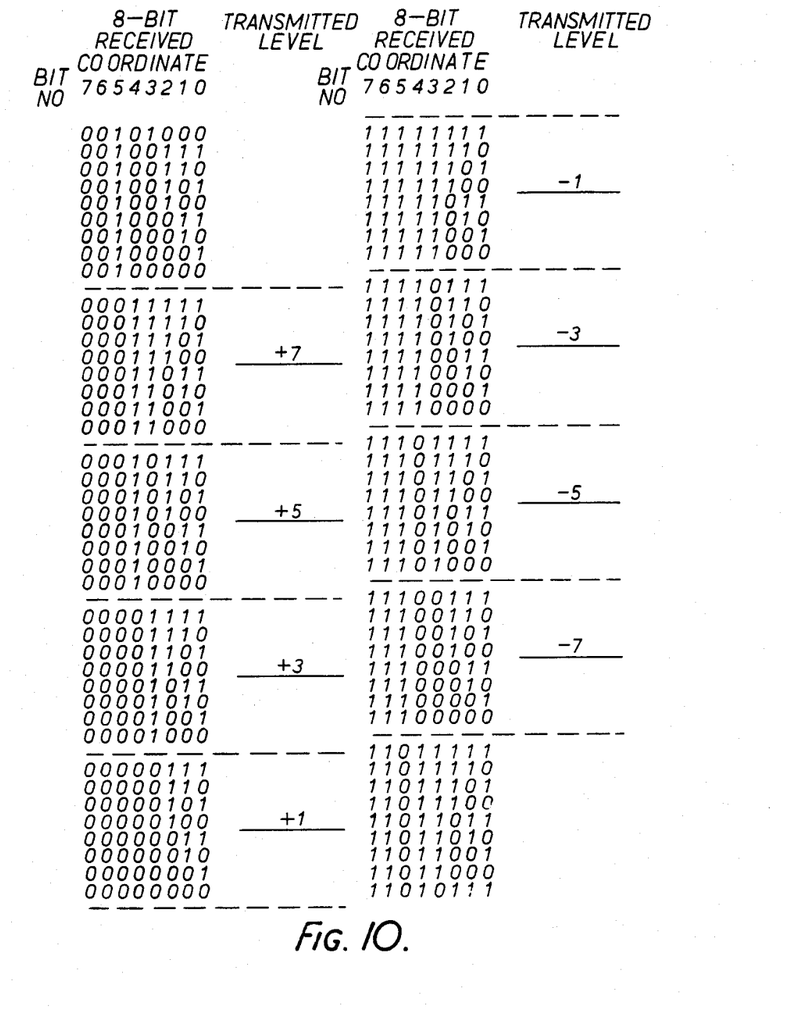
FIG. 10 shows a diagram of values of one of the eight bit co-ordinates from the equaliser (see FIG. 2) and also shows transmitted levels, FIGS. 11a and 11b respectively show in the requantisation process the normal position and the revised position of the thresholds after requantisation.

Due to the noise and other spurious conditions it is possible that the received amplitude will be outside the range indicated in FIG. 10. This is remedied by limiting the value to $+7$ or $-7$ as given in Block F.

For each current node, incremental scores are derived by considering the Euclidean distance between the received point and two of the four neighbouring C points in the signal constellation. The pair of the C points for which scores are computed is determined by the information shown in the trellis diagram, FIG. 6. The variables DC0, DC1, DC2, DC3 contain the incremental scores for C points C0, C1, C2, C3 respectively. DC1 is the contents of a look-up table address, LOOK, formed by combining the 4 least significant bits of the I and Q co-ordinates giving an 8-bit address. The other incremental scores are obtained by inverting one or other or both halves of LOOK and using this modified 8-bit word as the look-up table address.

The new scores ($NS_{0-3}$) can now be calculated by adding incremental scores to the score previously calculated for the current origin, in a manner similar to the example given earlier. Since there are two possible transitions per current node the transition yielding the lesser score (implying a greater probability) is in each case chosen.

All this information relating to the trellis diagram is stored in "circular" lists of length L. For convenience L is $2^N$ where N is an integer. Each node is assigned two such lists for storing the transition and the origin. Updating or shift register action is realised by a pointer system.

Instead of shifting the contents of one memory location to the next location for every location in the list, as in a shift register, the beginning and end of the equivalent shift register are marked by a pointer address which is incremented once for every shift of the shift register. To avoid using memory locations whose addresses increment indefinitely, the pointer address is incremented modulo L ($=2^N$) so that all the memory locations are contained in a list of size L. As a result, the same address may be used to extract information from the output end and then to store new information at the input end. The same pointer system is used to provide the input and output addresses for the two co-ordinate lists. Block J refers to this part of the program.

For every symbol period the expected transition, L symbols ago, is estimated by starting with the current node having the least score and then tracing a path back L symbols. The final transition traversed is taken to be the C point (TRANSITION) supposed to have been transmitted. Blocks K and L cover this operation.

The method by which the trellis path is traced back L symbols is as follows:

With reference to FIG. 7 the first address in the "circular" origin list for the current node with the least score $Z_0$ contains the estimated previous node, known as the current origin. Let us suppose the current origin is node $Z_1$. The next previous node, $Z_2$, is stored in the second address in the origin list for node $Z_1$. The next previous node $Z_3$ is stored in the third address in the origin list for node $Z_2$. When the final node $Z_L$ has been determined the final address in the transition list for node yields the desired output transition, $T_L = Y_1 Y_0$. This is shown in the table below. This method eliminates the need to transfer survivor path sequences from one memory location to another which is implied in most descriptions of Viterbi algorithm implementation. The transfer of large amounts of data from one memory location to another is time consuming and should be avoided if possible, when processing time is at a premium, as in this case.

TABLE

| | ORIGIN LISTS | | | | | TRANSITION LISTS | | | |
| | | Current Node ($Z_0$) With Least Score ↓ | | | | | | | |
| For Nodes | 0 | 1 | 2 | 3 | For Nodes | 0 | 1 | 2 | 3 |
| P 1st | | | $Z_1(1)$ | | | | | 00 | |
| (P-1)* 2nd | $Z_2(3)$ | | | | | | 11 | | |
| (P-2)* 3rd | | | | $Z_3(2)$ | | | | | 11 |
| (P-3)* 4th | | | $Z_4(1)$ | | | | | 00 | |
| (P-4)* 5th | $Z_5(2)$ | | | | | | 01 | | |
| (P-5)* 6th | | | $Z_6(0)$ | | | | | $T_6$ | |

TABLE-continued

ORIGIN LISTS

| | | Current Node ($Z_0$) With Least Score ↓ | | TRANSITION LISTS | | | |
|---|---|---|---|---|---|---|---|
| For Nodes 0 | 1 | 2 | 3 | For Nodes 0 | 1 | 2 | 3 |
| | | | | | | | 10 |

(P-n)* = P-n modulo L, where L = 6 in this example, and P is the address in memory known as the pointer.

As was described earlier the algorithm incorporates a false rotation monitoring feature.

Figure 12:
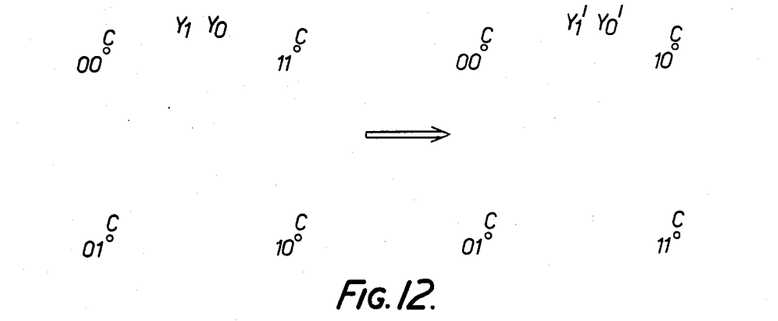
FIG. 12 shows the C point mapping process.

The parameter used to check whether or not the receiver is operating in the wrong phase is the result of the comparison between the dibit assigned to a C point's position and the dibit created by bit 3's of the I and Q co-ordinates i.e. is $Y_1'Y_0'=I_3Q_3$? The C point mapping, $Y_1Y_0$ to $Y_1'Y_0'$, is arranged as depicted in FIG. 12. The purpose of this mapping is to translate the set of C point codes into another set that represents their actual physical position $Y_1'Y_0'$. Obviously, one cannot always use such a parameter because it is valid only when the Viterbi system has settled down. Therefore the parameter should not be monitored during the first L symbols received. This is the function of Blocks M and N.

When the phase is correct, $Y_1'Y_0'=I_3Q_3$. After the mapping and checking processes are completed in Blocks O and P the program examines the region in which the received co-ordinate lies. Only if the co-ordinate lies within a small area around a point is it considered. This safeguard is necessary in order to minimise noise causing false error updates to the error counter.

Generally symbol errors caused by noise result from the received symbol co-ordinates lying outside the small area. Symbol errors caused only by rotation result from the received symbol co-ordinates lying exactly on an ideal point. Thus discrimination is made between symbol errors arising from the two causes.

In Block S the symbol error rate is checked, every symbol period. Should the threshold be attained the rotation matrix is updated by means of Block E. Otherwise the program continues to Block W where the six-bit word is derived by extracting two bits from I, two bits from Q and the two bits used for the C point code definition i.e. $I_5I_4Q_5Q_4Y_1Y_0$. Convolutional decoding must then be performed on $Y_1Y_0$. In the circuit this is easily performed by ignoring the second least significant bit. Note that in FIG. 3 $Y_0$ is just $X_1$ delayed by one delay unit. In other words if $Y_2$ through $Y_5$ are delayed by one unit and then tagged on to $Y_0$ the original 5-bit word is obtained.

Demapping of the 4 most significant bits is performed using a logic arrangement with exclusive-OR gates in circuit 22. A latch provides the 1-symbol delay required to line up the $Y_0$ bit with bits through $Y_2$ through $Y_5$. The 5-bit word is converted to a serial data stream with the parallel-to-serial converter before descrambling it and outputting the resultant data stream.

What we claim is:

1. A transmission system for the transmission of data or digitized analogue information from a transmitter to a receiver including a transmitter containing a convolutional encoder and a signal mapping device connected thereto to produce a two dimensional coded output signal, and including a receiver containing a convolutional decoder with soft decision decoding, connected to a reverse mapping means to produce output data, said transmitter including a serial-to-parallel converter producing n binary outputs only one of which is fed to the convolutional encoder which produces two binary output bits which are combined with the n−1 remaining bits and fed to the signal mapping device to produce the two dimensional coded output signal, the n−1 bits defining a square within a grid, within which square the two bits produced by the convolutional encoder define the position of the signals to be transmitted.

2. A transmission system as claimed in claim 1, in which data is transmitted between the transmitter and the receiver at n/(n+1) of the rate of the data incoming to the transmitter when the proposed redundant coding system is not used.

3. A transmission system as claimed in claim 2 in which the signals to be transmitted produced by the signal mapping device comprise four-bit in-phase co-ordinates fed to the I channel of a modulator and four-bit quadrature-phase co-ordinates which are fed to the Q channel of the modulator, the output of the modulator being the output of the transmitter.

4. A transmission system as claimed in claim 1 in which the receiver further includes an analogue to digital converter which produces from the input signal, a stream of parallel input binary digits, in which the convolutional decoder includes a Viterbi algorithm decoder operating on a number of the parallel input binary digits to produce binary digits analogous to the binary digits produced by the convolutional encoder in the transmitter.

5. A transmission system as claimed in claim 4 in which the output binary digits from the Viterbi algorithm decoder are combined with the remaining binary digits from the analogue to digital converter and are fed to the input of a requantiser which is responsive to the input binary digits to determine the most likely set of co-ordinates for each transmitted point of the two dimensional coded signal.

6. A transmission system as claimed in claim 5 in which the information is stored in two circular lists of length L for each of the four nodes, one storing successive origins and one storing corresponding transitions.

7. A transmission system as claimed in claim 6 in which the information relating to the trellis diagram is stored in such a manner that desired output information can be obtained by tracing a path back through the memory without any requirement for transferring all of the relevant memory contents.

8. A transmission system as claimed in claim 6 in which the information in the form of lists is stored in respective shift registers or their equivalents and in which the beginning and end of each equivalent shift register is marked by a pointer address which is incremented once for every shift of the shift register and in which to avoid using memory locations whose addresses increment indefinitely, the pointer address is incremented modulo L ($=2^N$) so that all memory locations are contained in a list of size L such that the same address can be used to extract information.

9. A transmission system as claimed in claim 5 including a phase ambiguity detector and corrector connected to the requantiser which uses the output binary digits from the Viterbi algorithm detector to derive a false transition rate on the trellis diagram, and when a threshold error rate is exceeded rotates the incoming signals.

10. A transmission system as claimed in claim 9 in which the phase ambiguity detector discriminates between false transitions caused by noise or by phase ambiguity by using a distance measurement of the received point from a given mapping point.

11. A data modem including a transmitter and a receiver as defined in any one of claims 1, 2, 3, 4, 5, 6, 7, 8, 9, or 10.

12. A data modem including a transmitter and a receiver as defined in claim 2.

* * * * *